(12) United States Patent
Ting et al.

(10) Patent No.: US 9,207,134 B2
(45) Date of Patent: Dec. 8, 2015

(54) ELECTRONIC DEVICE AND QUAD-AXIAL FORCE AND TORQUE MEASUREMENT SENSOR THEREOF

(71) Applicant: Chung-Yuan Christian University, Tao Yuan County (TW)

(72) Inventors: Yung Ting, Tao Yuan County (TW); Sheuan-Perng Lin, Tao Yuan County (TW)

(73) Assignee: CHUNG-YUAN CHRISTIAN UNIVERSITY, Tao Yuan County (TW)

( * ) Notice: Subject to any disclaimer, the term of this patent is extended or adjusted under 35 U.S.C. 154(b) by 0 days.

(21) Appl. No.: 14/584,631

(22) Filed: Dec. 29, 2014

(65) Prior Publication Data

US 2015/0107374 A1    Apr. 23, 2015

Related U.S. Application Data

(63) Continuation-in-part of application No. 13/856,831, filed on Apr. 4, 2013, now Pat. No. 8,963,534.

(30) Foreign Application Priority Data

Nov. 28, 2014 (TW) .............................. 103141369 A

(51) Int. Cl.
*G01R 29/22* (2006.01)
*G01L 5/16* (2006.01)
*B06B 1/06* (2006.01)
*G01L 1/16* (2006.01)
*H01L 41/12* (2006.01)
*H01L 41/22* (2013.01)

(52) U.S. Cl.
CPC ............... *G01L 5/167* (2013.01); *B06B 1/0622* (2013.01); *B06B 1/0644* (2013.01); *B06B 1/0692* (2013.01); *G01L 1/16* (2013.01); *H01L 41/125* (2013.01); *H01L 41/22* (2013.01)

(58) Field of Classification Search
CPC .. B06B 1/0692; B06B 1/0622; B06B 1/0644; G01R 5/28; H01L 41/22
USPC ................. 324/72, 76.11–76.83, 78, 83, 109; 310/309, 311–313 D
See application file for complete search history.

(56) References Cited

U.S. PATENT DOCUMENTS

| | | | | |
|---|---|---|---|---|
| 8,314,536 B2 * | 11/2012 | Ito | ............................. | G01L 1/16 310/365 |
| 8,421,311 B2 * | 4/2013 | Chuang | ..................... | G01L 1/16 310/328 |
| 2003/0227825 A1 * | 12/2003 | Benjamin | ............... | B06B 1/064 367/153 |
| 2012/0032559 A1 * | 2/2012 | Hino | ..................... | H01L 41/193 310/331 |

* cited by examiner

*Primary Examiner* — Jermele M Hollington
*Assistant Examiner* — Raul Rios Russo
(74) *Attorney, Agent, or Firm* — Muncy, Geissler, Olds & Lowe, P.C.

(57) ABSTRACT

A quad-axial force and torque measurement sensor is disclosed in the invention. The quad-axial force and torque measurement sensor includes a sensor main body which includes a polyvinylidene layer, a first circuit layer, and a second circuit layer. The polyvinylidene layer is located between the first circuit layer and the second circuit layer. The polyvinylidene layer includes a first polyvinylidene layer surface, a second polyvinylidene layer surface, a plurality of first electrodes, a plurality of second electrodes and a plurality of third electrodes. The first electrodes are located on the first polyvinylidene layer surface. The second electrodes and third electrodes are located on the second polyvinylidene layer surface, and the third electrodes are located around each of the second electrodes.

16 Claims, 11 Drawing Sheets

ELECTRONIC DEVICE AND QUAD-AXIAL FORCE AND TORQUE MEASUREMENT SENSOR THEREOF

BACKGROUND OF THE INVENTION

1. Field of the Invention

The present invention relates to a quad-axial force and torque measurement sensor; more particularly, the present invention relates to a quad-axial force and torque measurement sensor with high sensitivity and thin thickness.

2. Description of the Related Art

Piezoelectricity results from the conversion of mechanical energy, such as pressure causing a deformation of the piezoelectric material, to electricity; conversely, electricity applied to a piezoelectric material will be converted to mechanical energy. Since the discovery of the piezoelectric property of barium titanate (BaTiO$_3$) in 1942, research on piezoelectric materials has developed well, and many kinds of piezoelectric applications have been disclosed; for example, piezoelectric materials can be used for producing piezoelectric thin films to form a sensing element.

The most common piezoelectric ate al is the inorganic ceramic (such as barium titanate and lead zirconate titanate). An inorganic ceramic has the features of small volume, great response speed, and low power consumption for displacement. However, the uses of piezoelectric materials are limited. For example, since piezoelectric materials are brittle, the structure of the piezoelectric thin film may fracture easily when sustaining an uneven force. In addition, since inorganic piezoelectric materials are hard, brittle and heavy, it is difficult and expensive to produce a thin and small thin film or a thin film with a complex shape. Also, because the piezoelectric thin film of the prior art can only sense changes in one or two directions (such as an X axis and a Y axis), it is difficult to sense changes in three or more directions.

Therefore, there is a need to provide a new piezoelectric thin film sensor made of piezoelectric material and having high sensitivity and thin thickness that can sense changes on four axes.

SUMMARY OF THE INVENTION

It is an object of the present invention to provide a quad-axial force and torque measurement sensor with high sensitivity and thin thickness.

To achieve the abovementioned object, the quad-axial force and torque measurement sensor of the present invention includes a sensor main body. The sensor main body includes a polyvinylidene (PVDF) layer, a first circuit layer, and a second circuit layer. The polyvinylidene layer includes a first polyvinylidene layer surface, a second polyvinylidene layer surface, a plurality of first electrodes, a plurality of second electrodes, and a plurality of third electrodes. The plurality of first electrodes are located on the first polyvinylidene layer surface. The plurality of second electrodes are located on the second polyvinylidene layer surface. The plurality of third electrodes are located on the second polyvinylidene layer surface, and are surrounding each of the second electrodes, wherein each of the first electrodes and each of the second electrodes are corresponded to each other to form a polarization direction of an X axis, a polarization direction of a Y axis, and a polarization direction of a Z axis, and each of the third electrodes forms an annular polarization direction which surrounds the Z axis. The first circuit layer includes a first circuit layer first surface, a first circuit layer second surface, a plurality of first electronic connecting parts, and a plurality of first signal circuits. The plurality of first electronic connecting parts are located on the first circuit layer first surface. Each of the first electronic connecting parts and each of the first electrodes are corresponded to each other. The plurality of first signal circuits are located on the first circuit layer second surface. The second circuit layer includes a second circuit layer first surface, a second circuit layer second surface, a plurality of second electronic connecting parts, and a plurality of second signal circuits. The plurality of second electronic connecting parts are located on the second circuit layer first surface. Each of the second electronic connecting parts and each of the second electrodes are corresponded to each other. The plurality of second signal circuits are located on the second circuit layer second surface. The polyvinylidene layer is located between the first circuit layer and the second circuit layer. When the polyvinylidene layer is deformed by an external force, the plurality of first signal circuits and the plurality of second signal circuits transfer an electronic signal caused by the deformation of the polyvinylidene layer.

According to one embodiment of the present invention, the first electrode includes a center part, a plurality of linear sections, and an annular part. The plurality of linear sections surround the annular part and the annular part surrounds the center part to generate the polarization direction of the X axis and the polarization direction of the Y axis.

According to one embodiment of the present invention, the second electrode includes a corresponding center part and a corresponding annular part; the corresponding center part and the corresponding annular part are corresponded to the center part to generate the polarization direction of the Z axis.

According to one embodiment of the present invention, the third electrode includes a plurality of electrode bars surrounding the corresponding center part, wherein the lengths of all electrode bars are the same and the electrode bars are arranged in an equidistant manner to generate the annular polarization direction which surrounds the Z axis.

According to one embodiment of the present invention, the plurality of first electrodes, the plurality of second electrodes and the plurality of third electrodes are made via a Physical Vapor Deposition (PVD) process.

According to one embodiment of the present invention, the quad-axial force and torque measurement sensor further includes two insulation layers, and the two insulation layers are respectively located above the first circuit layer and under the second circuit layer.

According to one embodiment of the present invention, the quad-axial force and torque measurement sensor further includes two rubber layers. The two insulation layers and the sensor main body are located between the two rubber layers.

According to one embodiment of the present invention, each of the rubber layers includes a plurality of protruding parts, and the plurality of protruding parts contact the insulation layer.

It is another object of the present invention to provide an electronic device with a quad-axial force and torque measurement sensor, the quad-axial force and torque measurement sensor having high sensitivity and thin thickness.

To achieve the abovementioned object, the electronic device of the present invention includes a processor, a power part, and a quad-axial force and torque measurement sensor. The power part is electrically connected to the processor. The quad-axial force and torque measurement sensor is electrically connected to the processor and has a sensor main body. The sensor main body includes a polyvinylidene layer, a first circuit layer, and a second circuit layer. The polyvinylidene layer includes a first polyvinylidene layer surface, a second polyvinylidene layer surface, a plurality of first electrodes, a plurality of second electrodes, and a plurality of third electrodes. The plurality of first electrodes are located on the first polyvinylidene layer surface. The plurality of second electrodes are located on the second polyvinylidene layer surface. The plurality of third electrodes are located on the second polyvinylidene layer surface and are surrounding each of the second electrodes, wherein each of the first electrodes and each of the second electrodes are corresponded to each other to form a polarization direction of an X axis, a polarization direction of a Y axis, and a polarization direction of a Z axis, and each of the third electrodes form an annular polarization direction which surrounds the Z axis. The first circuit layer includes a first circuit layer first surface, a first circuit layer second surface, a plurality of first electronic connecting parts, and a plurality of first signal circuits. The plurality of first electronic connecting parts are located on the first circuit layer first surface. Each of the first electronic connecting parts and each of the first electrodes are corresponded to each other. The plurality of first signal circuits are located on the first circuit layer second surface. The second circuit layer includes a second circuit layer first surface, a second circuit layer second surface, a plurality of second electronic connecting parts, and a plurality of second signal circuits. The plurality of second electronic connecting parts are located on the second circuit layer first surface. Each of the second electronic connecting parts and each of the second electrodes are corresponded to each other. The plurality of second signal circuits are located on the second circuit layer second surface. The polyvinylidene layer is located between the first circuit layer and the second circuit layer. When the polyvinylidene layer is deformed by an external force, the plurality of first signal circuits and the plurality of second signal circuits transfer an electronic signal caused by the deformation of the polyvinylidene layer to the processor.

DETAILED DESCRIPTION OF THE PREFERRED EMBODIMENT

These and other objects and advantages of the present invention will become apparent from the following description of the accompanying drawings, which disclose several embodiments of the present invention. It is to be understood that the drawings are to be used for purposes of illustration only, and not as a definition of the invention.

Figure 1:
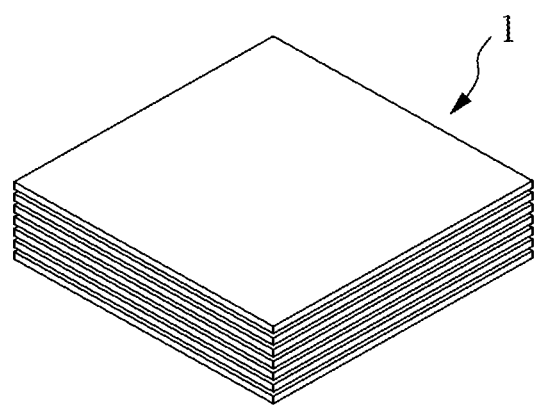
FIG. 1 illustrates a schematic drawing of the quad-axial force and torque measurement sensor of the first embodiment of the present invention.
Figure 2:
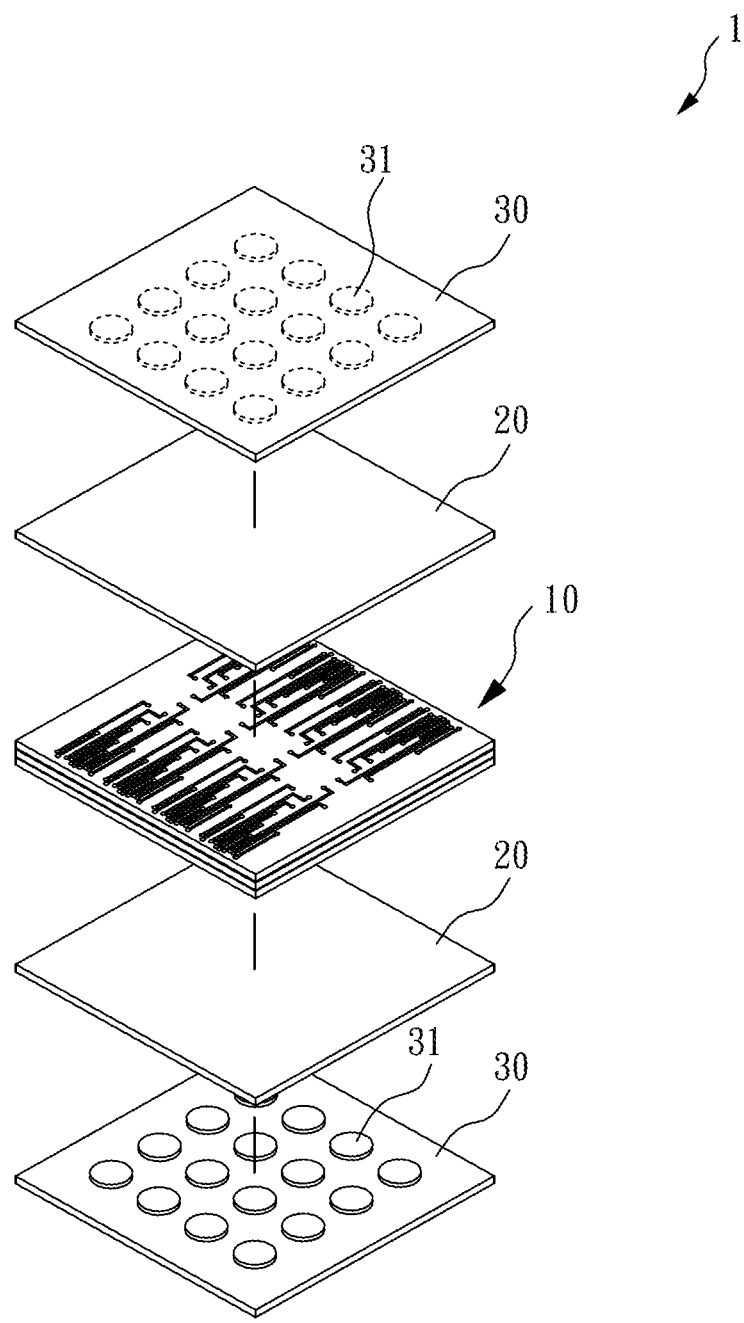
FIG. 2 illustrates an exploded perspective view of the quad-axial force and torque measurement sensor of the first embodiment of the present invention.
Figure 3:
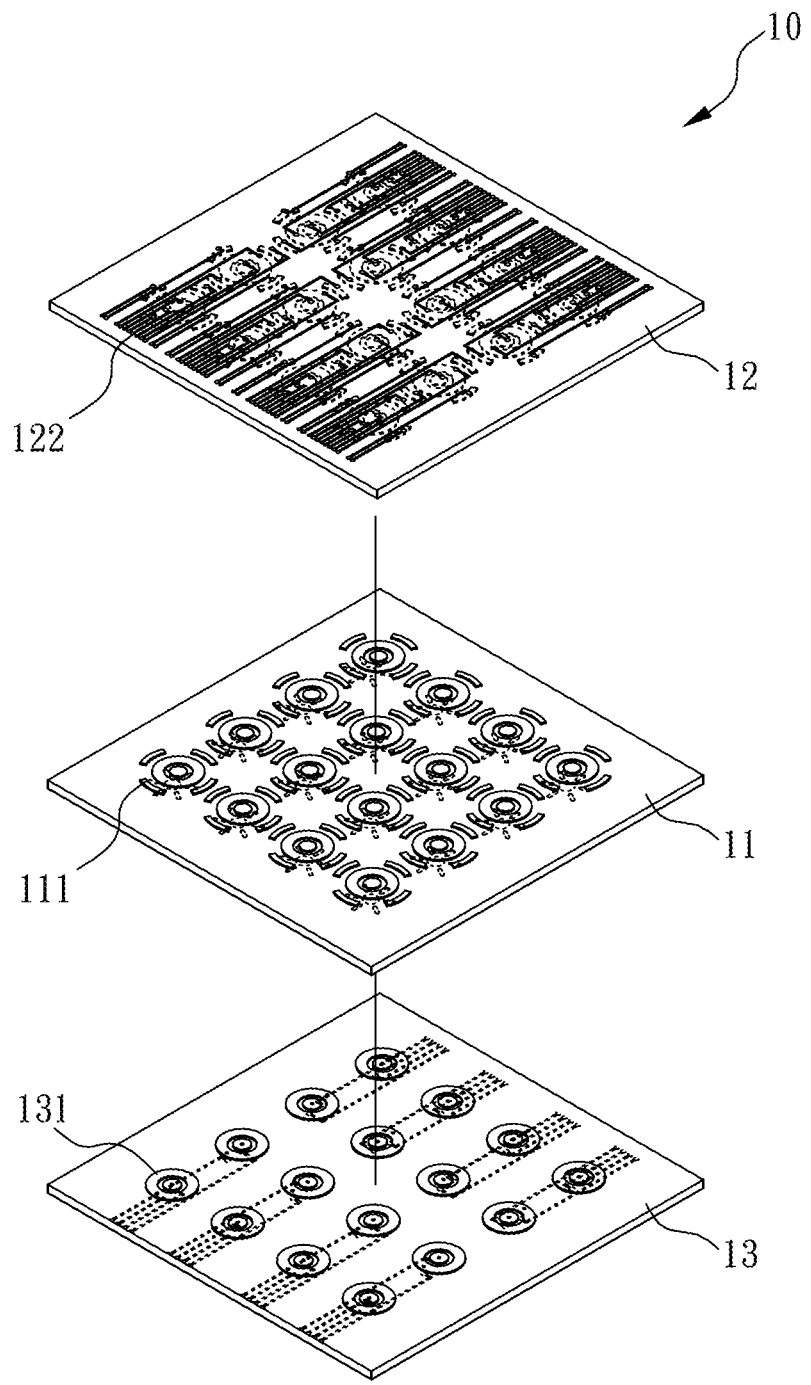
FIG. 3 illustrates an exploded perspective view of the sensor main body of the first embodiment of the present invention.
Figure 5A:
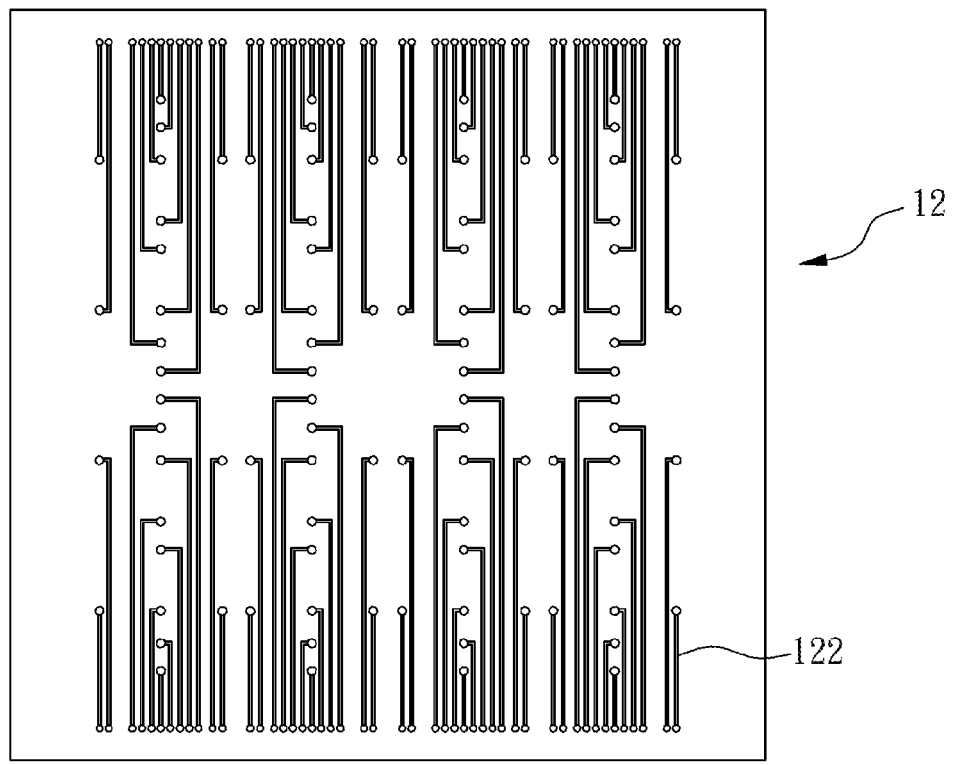
FIG. 5A illustrates a schematic drawing of one first circuit layer surface of the first circuit layer of the first embodiment of the present invention.
Figure 5B:
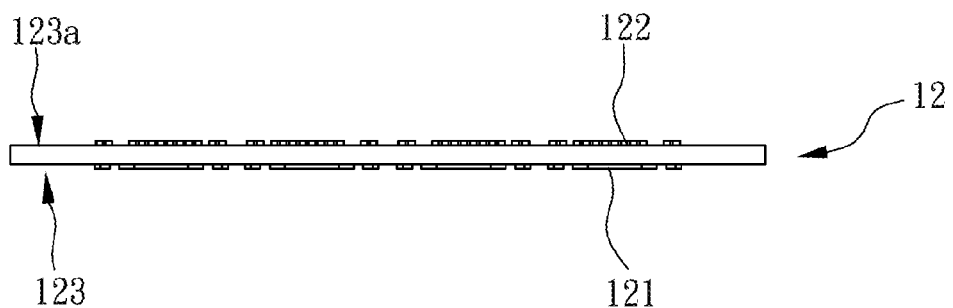
FIG. 5B illustrates a side view of the first circuit layer of the first embodiment of the present invention.
Figure 5C:
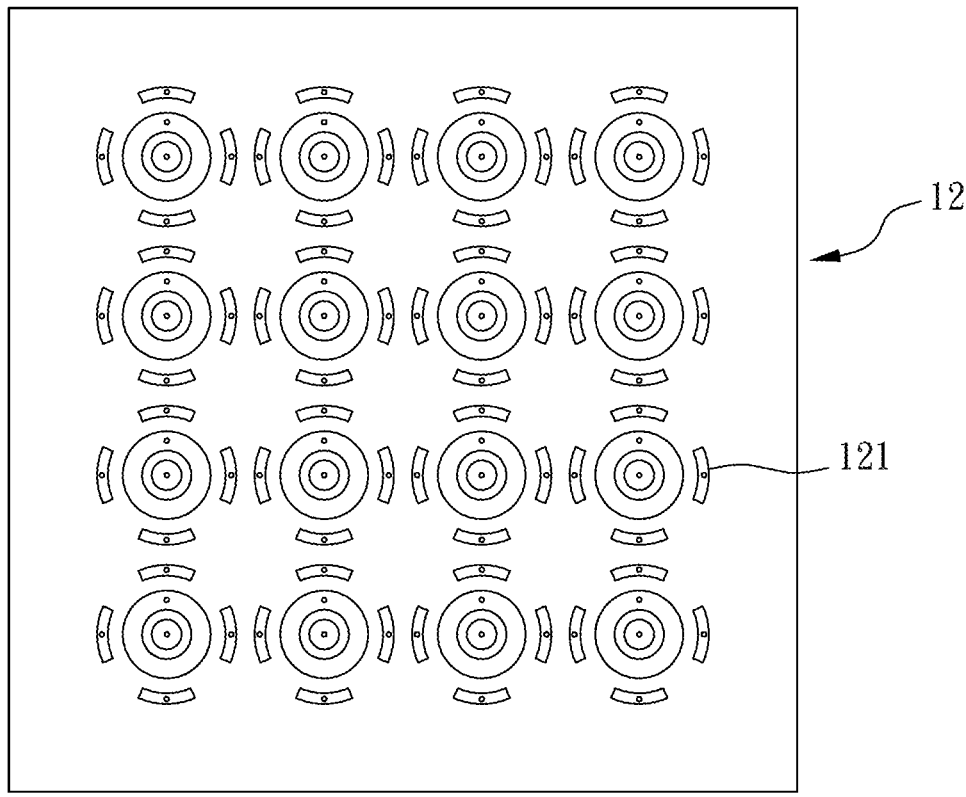
FIG. 5C illustrates a schematic drawing of another first circuit layer surface of the first circuit layer of the first embodiment of the present invention.
Figure 6A:
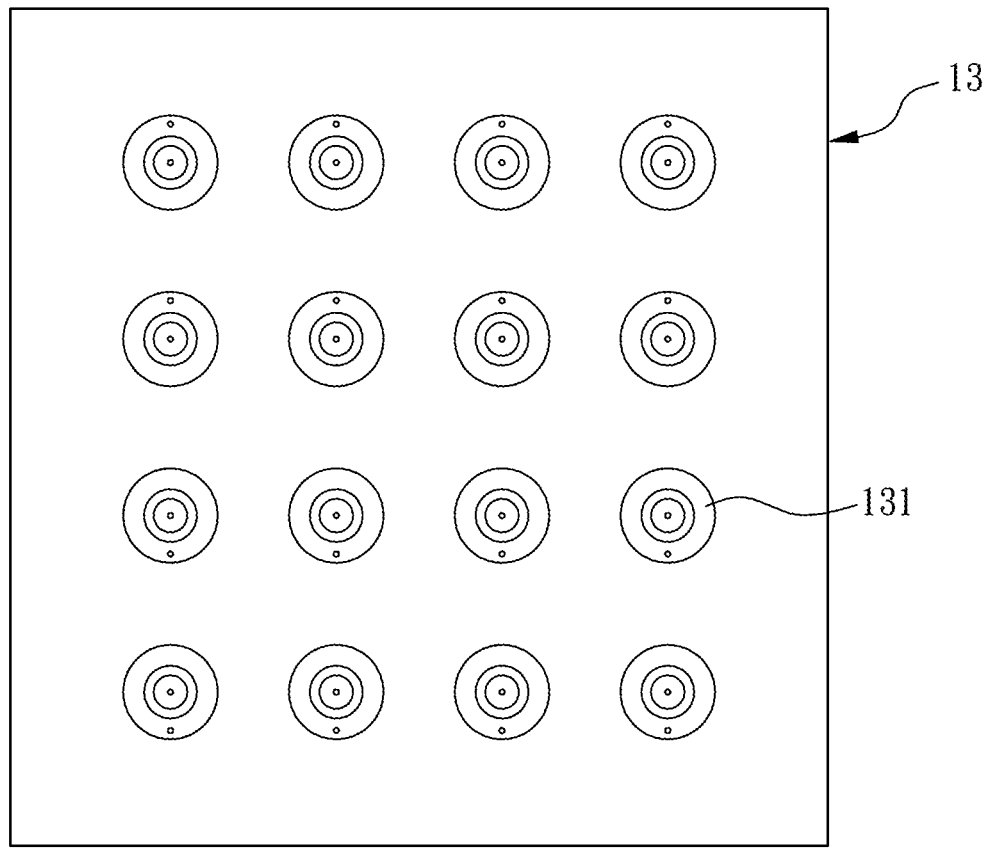
FIG. 6A illustrates a schematic drawing of one second circuit layer surface of the second circuit layer of the first embodiment of the present invention.
Figure 6B:
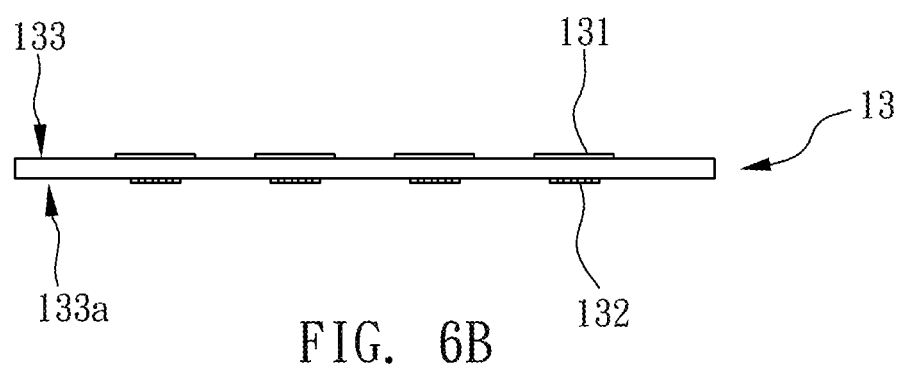
FIG. 6B illustrates a side view of the second circuit layer of the first embodiment of the present invention.
Figure 6C:
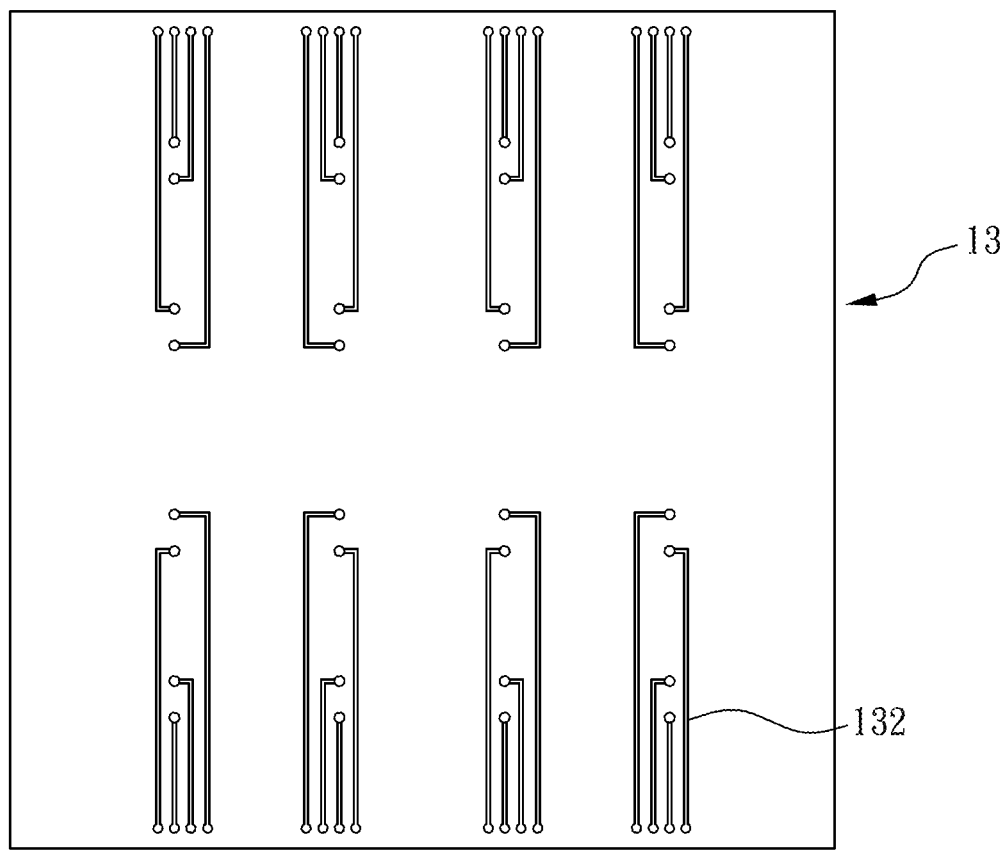
FIG. 6C illustrates a schematic drawing of another second circuit layer surface of the second circuit layer of the first embodiment of the present invention.
Figure 7:
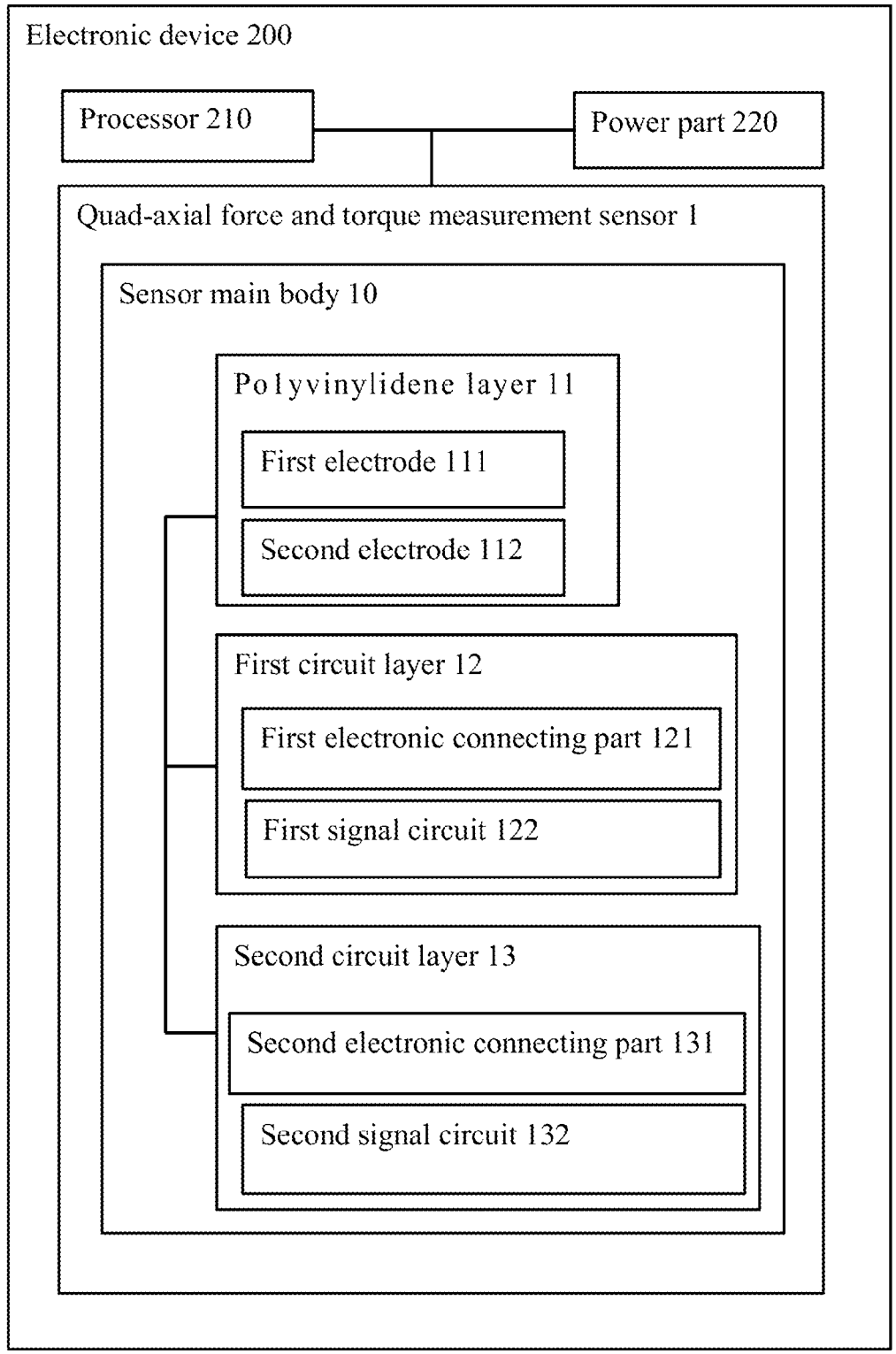
FIG. 7 illustrates a system structure drawing of the electronic device and the quad-axial force and torque measurement sensor of the first embodiment of the present invention.

Please refer to FIG. 1 to FIG. 7 about the electronic device and the quad-axial force and torque measurement sensor according to the first embodiment of the present invention. FIG. 1 illustrates a schematic drawing of the quad-axial force and torque measurement sensor of the first embodiment of the present invention. FIG. 2 illustrates an exploded perspective view of the quad-axial force and torque measurement sensor of the first embodiment of the present invention. FIG. 3 illustrates an exploded perspective view of the sensor main body of the first embodiment of the present invention. FIG. 4A illustrates a schematic drawing of one polyvinylidene layer surface of the polyvinylidene layer of the first embodiment of the present invention. FIG. 4B illustrates a side view of the polyvinylidene layer of the first embodiment of the present invention. FIG. 4C illustrates a schematic drawing of another polyvinylidene layer surface of the polyvinylidene layer of the first embodiment of the present invention. FIG. 4D illustrates a schematic drawing of the polarization direction of the first embodiment of the present invention. FIG. 4E illustrates a schematic drawing of the second electrode of the first embodiment of the present invention. FIG. 5A illustrates a schematic drawing of one first circuit layer surface of the first circuit layer of the first embodiment of the present invention. FIG. 5B illustrates a side view of the first circuit layer of the first embodiment of the present invention. FIG. 5C illustrates a schematic drawing of another first circuit layer surface of the first circuit layer of the first embodiment of the present invention. FIG. 6A illustrates a schematic drawing of one second circuit layer surface of the second circuit layer of the first embodiment of the present invention. FIG. 6B illustrates a side view of the second circuit layer of the first embodiment of the present invention. FIG. 6C illustrates a schematic drawing of another second circuit layer surface of the second circuit layer of the first embodiment of the present invention. FIG. 7 illustrates a system structure drawing of the electronic device and the quad-axial force and torque measurement sensor of the first embodiment of the present invention.

As shown in FIG. 1, FIG. 2 and FIG. 7, in the first embodiment of the present invention, the electronic device 200 includes a quad-axial force and torque measurement sensor 1, a processor 210, and a power part 220. The quad-axial force and torque measurement sensor 1, the processor 210, and the power part 220 are electrically connected to each other. The electronic device 200 of the present invention is a device with the touch function, such as a cell phone, a signature pad, a drafting board, or a tablet computer. The quad-axial force and torque measurement sensor 1 is used for sensing quad-axial changes and transferring the corresponding electronic signals to the processor 210 according to the quad-axial changes; the four axes of the present invention are an X axis, a Y axis, a Z axis, and an annular direction surrounding the Z axis. The processor 210 is used for controlling the electronic component in the electronic device 200 and for receiving and processing the electronic signal transferred by the quad-axial force and torque measurement sensor 1 to control the other electronic components to execute corresponding actions according to the electronic signal. The power part 220 is a battery used for providing power to the quad-axial force and torque measurement sensor 1.

As shown in FIG. 1 to FIG. 3, in the first embodiment of the present invention, the quad-axial force and torque measurement sensor 1 includes a sensor main body 10, two insulation layers 20, and two rubber layers 30. The sensor main body 10 includes a polyvinylidene (PVDF) layer 11, a first circuit layer 12, and a second circuit layer 13.

Figure 4A:
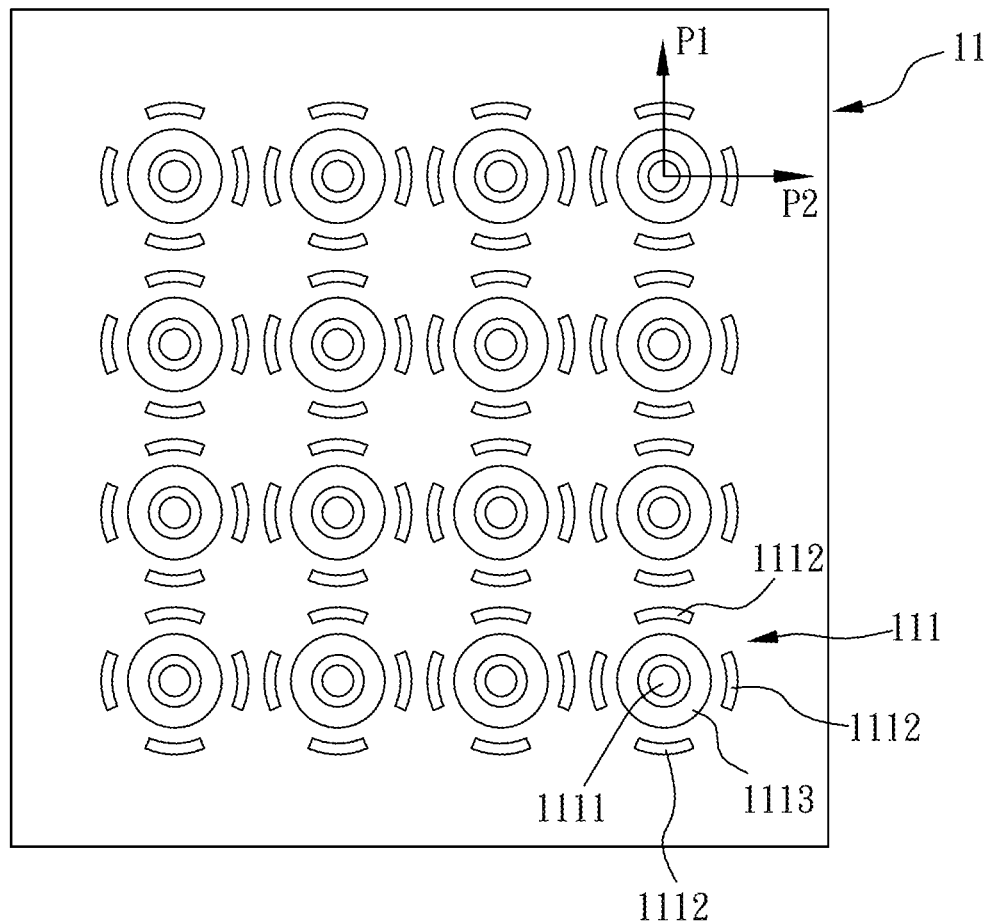
FIG. 4A illustrates a schematic drawing of one polyvinylidene layer surface of the polyvinylidene layer of the first embodiment of the present invention.
Figure 4B:
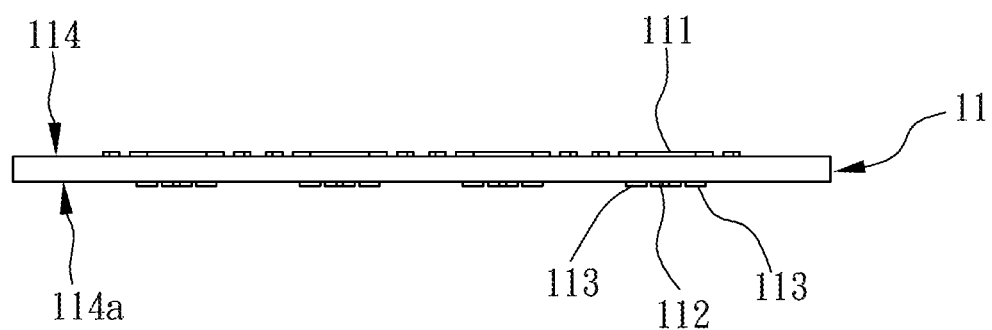
FIG. 4B illustrates a side view of the polyvinylidene layer of the first embodiment of the present invention.
Figure 4C:
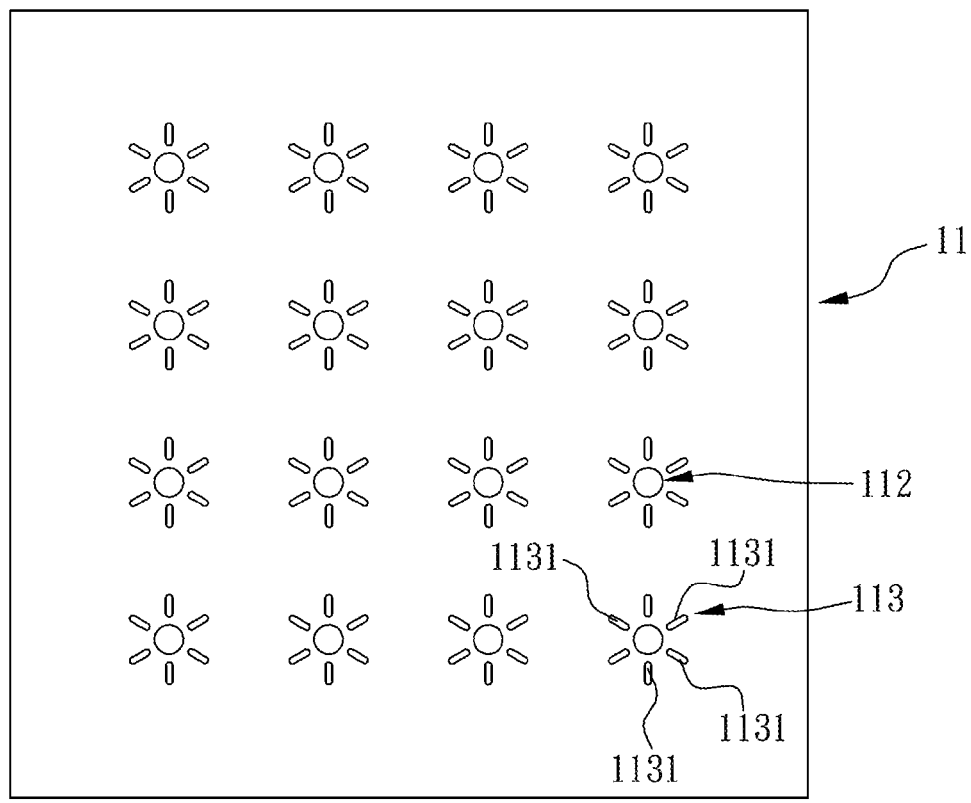
FIG. 4C illustrates a schematic drawing of another polyvinylidene layer surface of the polyvinylidene layer of the first embodiment of the present invention.
Figure 4D:
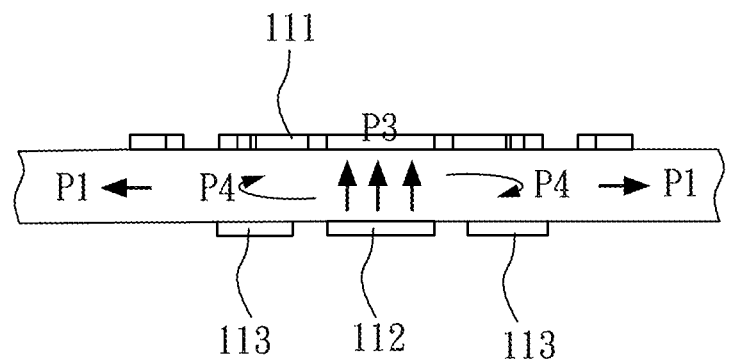
FIG. 4D illustrates a schematic drawing of the polarization direction of the first embodiment of the present invention.
Figure 4E:
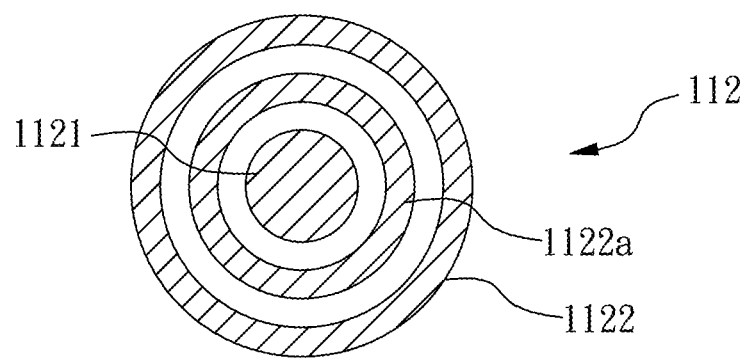
FIG. 4E illustrates a schematic drawing of the second electrode of the first embodiment of the present invention.

As shown in FIG. 4A to FIG. 4E, in the first embodiment of the present invention, the polyvinylidene layer 11 includes a first polyvinylidene layer surface 114, a second polyvinylidene layer surface 114a, a plurality of first electrodes 111, a plurality of second electrodes 112, and a plurality of third electrodes 113. The plurality of first electrodes 111, the plurality of second electrodes 112, and the plurality of third electrodes 113 of the present invention are made via a Physical Vapor Deposition (PVD) process. The plurality of first electrodes 111 are located on the first polyvinylidene layer surface 114. Each of the first electrodes 111 includes a center part 1111, a plurality of linear sections 1112, and an annular part 1113. The plurality of linear sections 1112 surround the annular part 1113, and the annular part 1113 surrounds the center part 1111, to generate the polarization direction P1 of an X axis and the polarization direction P2 of a Y axis. The plurality of second electrodes 112 are located on the second polyvinylidene layer surface 114a. Each of the second electrodes 112 includes a corresponding center part 1121 and two corresponding annular parts 1122, 1122a, wherein the corresponding annular part 1122a surrounds the corresponding center part 1121, and the corresponding annular part 1122 surrounds the corresponding annular part 1122a and the corresponding center part 1121. The position of the corresponding center part 1121 and the corresponding annular parts 1122, 1122a of the second electrode 112 are corresponded to the position of the center part 1111 of the first electrode 111 to generate the polarization direction P3 of a Z axis; however, the amount of the corresponding annular parts 1122, 1122a is not limited to two. The plurality of third electrodes 113 is located on the second polyvinylidene layer surface 114a, and surrounding each of the second electrodes 112. Each of the third electrodes 113 includes a plurality of electrode bars 1131, and the plurality of electrode bars 1131 surround each of the corresponding center parts 1121, wherein the lengths of each of the electrode bars 1131 are the same and the electrode bars 1131 are arranged in an equidistant manner to generate the annular polarization direction P4 which surrounds the Z axis. The annular polarization direction P4 which surrounds the Z axis is used for measuring changes in the torque which surrounds the Z axis, and the polarization direction is an arc-shape direction, such that the corresponding center part 1121 is designed to be surrounded by the corresponding annular parts 1122, 1122a (as shown in FIG. 4E), and each of the corresponding annular parts 1122, 1122a are arranged outwardly with a same center; therefore, the quad-axial force and torque measurement sensor 1 can sense a torque signal with a large range and high density. However, the shape of the center part 1111 of the first electrode 111 is not limited to the abovementioned design; for example, the center part 1111 can be designed as a square, and the linear sections 1112 can be located on the outside of each side of the square, to generate the polarization direction P1 of an X axis and the polarization direction P2 of a Y axis; the corresponding center part 1121 of each second electrode 112 can also be designed as a square, and the corresponding annular parts 1122, 1122a can be designed as a square frame, to correspond the center part 1111 to generate the polarization direction P3 of a Z axis.

Via the abovementioned corresponding of each first electrode 111 and each second electrode 112, the polarization direction P1 of an X axis, the polarization direction P2 of a Y axis, and the polarization direction P3 of a Z axis can be formed; when the polyvinylidene layer 11 is deformed along the X axis, Y axis, and Z axis by an external force, the electronic signal will be generated via piezoelectricity. In addition, each third electrode 113 forms the annular polarization direction P4 surrounding the Z axis; when the polyvinylidene layer 11 is deformed along the annular direction surrounding the Z axis by an external force, the electronic signal will be generated via piezoelectricity Because direct piezoelectricity is already disclosed in the prior art, there is no need for further description.

As shown in FIG. 5A to FIG. 5C, and in FIG. 7, in the first embodiment of the present invention, the first circuit layer 12 includes a first circuit layer first surface 123, a first circuit layer second surface 123a, a plurality of first electronic connecting parts 121, and a plurality of first signal circuits 122. The plurality of first electronic connecting parts 121 are located on the first circuit layer first surface 123, and each of the first electronic connect parts 121 and each of the first electrodes 111 are corresponded and electrically connected to each other for receiving the electronic signal transferred from the first electrode 111 of the polyvinylidene layer 11. The plurality of first signal circuits 122 are located on the first circuit layer second surface 123a and electrically connected to the processor 210.

As shown in FIG. 6A to FIG. 6C, and in FIG. 7, in the first embodiment of the present invention, the second circuit layer 13 includes a second circuit layer first surface 133, a second circuit layer second surface 133a, a plurality of second electronic connecting parts 131, and a plurality of second signal circuits 132. The plurality of second electronic connecting parts 131 are located on the second circuit layer first surface 133. Each of the second electronic connecting parts 131 and each of the second electrodes 112 are corresponded and electrically connected to each other to receive the electronic signal transferred from the second electrode 112 of the polyvinylidene layer 11. The plurality of second signal circuits 132 are located on the second circuit layer second surface 133a and electrically connected to the processor 210.

As shown in FIG. 3 and FIG. 7, in the first embodiment of the present invention, the polyvinylidene layer 11 is located between the first circuit layer 12 and the second circuit layer 13. When the polyvinylidene layer 11 is deformed by an external force, the polyvinylidene layer 11 will generate the corresponding electronic signal according to the deformation of the X axis, the deformation of the Y axis, the deformation of the Z axis, and the surrounding deformation of the Z axis; then, via the electronic connection between the first electronic connecting part 121 and the first electrode 111 and the electronic connection between the second electronic connecting part 131 and the second electrode 112, the plurality of first signal circuits 122 and the plurality of second signal circuits 132 can transfer the corresponding electronic signal generated by the deformation of the polyvinylidene layer 11 to the first circuit layer 12 and the second circuit layer 13. After receiving the electronic signal, the first circuit layer 12 and the second circuit layer 13 transfer the electronic signal to the processor 210 via the first signal circuit 122 and the second signal circuit 132 such that the processor 210 can analyze the received electronic signal to determine the changing of the force and direction on four axes. Therefore, via the sensing of the quad-axial force and torque measurement sensor 1 for the abovementioned force and direction, the electronic device 200 of the present invention can sensitively sense changes in the touching force and direction; therefore, the electronic device 200 of the present invention can be applied to applications such as signature recognition, handwriting, drawing, or other applications which require great quad-axial sensitivity.

As shown in FIG. 2, in the first embodiment of the present invention, two insulation layers 20 are respectively located above the first circuit layer 12 and under the second circuit layer 13. The insulation layer 20 is used for isolating the electronic component and protecting the electronic circuit. The two insulation layers 20, the first circuit layer 12, and the second circuit layer 13 are located between the two rubber layers 30. Each rubber layer 30 includes a plurality of protruding parts 31, and the plurality of protruding parts 31 contact the insulation layer 20. When an external force is applied to the quad-axial force and torque measurement sensor 1, the protruding part 31 will enhance the effect of the external force, allowing the sensitivity of the sensor main body 10 of the quad-axial force and torque measurement sensor 1 to be enhanced.

The first circuit layer 12 and the second circuit layer 13 of the present invention can be designed as a polymer board which is plated with a metal circuit to form the first electronic connecting part 121, the first signal circuit 122, the second electronic connecting part 131, and the second signal circuit 132. Because the plating technology is already disclosed in the prior art, there is no need for further description. As determined by actual experiments performed by the inventor, the thickness of the polyvinylidene layer 11 of the present invention is about 10 µm, such that the height of the quad-axial force and torque measurement sensor 1 can be reduced to achieve the object of miniaturization and thinness.

Via the design of the electronic device and the quad-axial force and torque measurement sensor of the present invention, the quad-axial force and torque measurement sensor can have great sensitivity and be small and thin, and the quad-axial force and torque measurement sensor can sense quad-axial changes. Therefore, the electronic device of the present invention can be applied to the applications of signature recognition, handwriting, drawing, or other applications which need great quad-axial sensitivity.

It is noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A quad-axial force and torque measurement sensor, comprising:
   a sensor main body, comprising:
      a polyvinylidene layer, comprising:
         a first polyvinylidene layer surface;
         a second polyvinylidene layer surface;
      a plurality of first electrodes, located on the first polyvinylidene layer surface;
      a plurality of second electrodes, located on the second polyvinylidene layer surface; and
      a plurality of third electrodes, located on the second polyvinylidene layer surface, and surrounding each of the second electrodes;
      wherein each of the first electrodes and each of the second electrodes are corresponded to each other, to form a polarization direction of an X axis, a polarization direction of a Y axis, and a polarization direction of a Z axis, each of the third electrodes forming an annular polarization direction which surrounds the Z axis;
   a first circuit layer, comprising:
      a first circuit layer first surface;
      a first circuit layer second surface;
      a plurality of first electronic connecting parts, located on the first circuit layer first surface, and each of the first electronic connecting parts and each of the first electrodes are corresponded to each other; and
      a plurality of first signal circuits, located on the first circuit layer second surface; and
   a second circuit layer, comprising:
      a second circuit layer first surface;
      a second circuit layer second surface;
      a plurality of second electronic connecting parts, located on the second circuit layer first surface, and each of the second electronic connecting parts and each of the second electrodes are corresponded to each other; and
      a plurality of second signal circuits, located on the second circuit layer second surface;
   wherein the polyvinylidene layer is located between the first circuit layer and the second circuit layer, such that when the polyvinylidene layer is deformed by an external force, the plurality of first signal circuits and the plurality of second signal circuits transfer an electronic signal caused by the deformation of the polyvinylidene layer.

2. The quad-axial force and torque measurement sensor as claimed in claim 1, wherein the first electrode comprises a center part, a plurality of linear sections and an annular part, the plurality of linear sections surrounding the annular part and the annular part surrounding the center part, to generate the polarization direction of the X axis and the polarization direction of the Y axis.

3. The quad-axial force and torque measurement sensor as claimed in claim 2, wherein the second electrode comprises a corresponding center part and a corresponding annular part, the corresponding center part and the corresponding annular part being corresponded to the center part, to generate the polarization direction of the Z axis.

4. The quad-axial force and torque measurement sensor as claimed in claim 3, wherein the third electrode comprises a plurality of electrode bars, the plurality of electrode bars surrounding the corresponding center part, wherein the lengths of each electrode bar are the same and the plurality of electrode bars are arranged in an equidistant manner, to generate the annular polarization direction which surrounds the Z axis.

5. The quad-axial force and torque measurement sensor as claimed in claim 4, wherein the plurality of first electrodes, the plurality of second electrodes and the plurality of third electrodes are made via a Physical Vapor Deposition (PVD) process.

6. The quad-axial force and torque measurement sensor as claimed in claim 5, further comprising two insulation layers, the two insulation layers being respectively located above the first circuit layer and under the second circuit layer.

7. The quad-axial force and torque measurement sensor as claimed in claim 6, further comprising two rubber layers, the two insulation layers and the sensor main body being located between the two rubber layers.

8. The quad-axial force and torque measurement sensor as claimed in claim 7, wherein each of the rubber layers comprises a plurality of protruding parts, the plurality of protruding parts contacting the insulation layer.

9. An electronic device, comprising:
 a processor;
 a power part, electrically connected to the processor; and
 a quad-axial force and torque measurement sensor, electrically connected to the processor, the quad-axial force and torque measurement sensor comprising a sensor main body, the sensor main body comprising:
 a polyvinylidene (PVDF) layer, comprising:
  a first polyvinylidene layer surface;
  a second polyvinylidene layer surface;
  a plurality of first electrodes, located on the first polyvinylidene layer surface;
  a plurality of second electrodes, located on the second polyvinylidene layer surface; and
  a plurality of third electrodes, located on the second polyvinylidene layer surface, and surrounding each of the second electrodes;
  wherein each of the first electrodes and each of the second electrodes are corresponded to each other, to form a polarization direction of an X axis, a polarization direction of a Y axis, and a polarization direction of a Z axis, each of the third electrodes forming an annular polarization direction which surrounds the Z axis;
 a first circuit layer, comprising:
  a first circuit layer first surface;
  a first circuit layer second surface;
  a plurality of first electronic connecting parts, located on the first circuit layer first surface, and each of the first electronic connecting parts and each of the first electrodes being corresponded to each other; and
  a plurality of first signal circuits, located on the first circuit layer second surface; and
 a second circuit layer, comprising:
  a second circuit layer first surface;
  a second circuit layer second surface;
  a plurality of second electronic connecting parts, located on the second circuit layer first surface, and each of the second electronic connecting parts and each of the second electrodes are corresponded to each other; and
  a plurality of second signal circuits, located on the second circuit layer second surface;
  wherein the polyvinylidene layer is located between the first circuit layer and the second circuit layer such that when the polyvinylidene layer is deformed by an external force, the plurality of first signal circuits and the plurality of second signal circuits transfer an electronic signal caused by the deformation of the polyvinylidene layer to the processor.

10. The electronic device as claimed in claim 9, wherein the first electrode comprises a center part, a plurality of linear sections and an annular part, the plurality of linear sections surrounding the annular part and the annular part surrounding the center part, to generate the polarization direction of the X axis and the polarization direction of the Y axis.

11. The electronic device as claimed in claim 10, wherein the second electrode comprises a corresponding center part and a corresponding annular part, the corresponding center part and the corresponding annular part being corresponded to the center part, to generate the polarization direction of the Z axis.

12. The electronic device as claimed in claim 11, wherein the third electrode comprises a plurality of electrode bars, the plurality of electrode bars surrounding the corresponding center part, wherein the lengths of each electrode bar are the same and the plurality of electrode bars are arranged in an equidistant manner, to generate the annular polarization direction which surround the Z axis.

13. The electronic, device as claimed in claim 12, wherein the plurality of first electrodes, the plurality of second electrodes and the plurality of third electrodes are made via a Physical Vapor Deposition (PVD) process.

14. The electronic device as claimed in claim 13, wherein the quad-axial force and torque measurement sensor further comprises two insulation layers, the two insulation layers being respectively located above the first circuit layer and under the second circuit layer.

15. The electronic device as claimed in claim 14, wherein the quad-axial force and torque measurement sensor further comprises two rubber layers, the two insulation layers and the sensor main body being located between the two rubber layers.

16. The electronic device as claimed in claim 15, wherein each of the rubber layers comprises a plurality of protruding parts, the plurality of protruding parts contacting the insulation layer.

* * * * *